United States Patent
Ishidu et al.

(10) Patent No.: US 7,518,155 B2
(45) Date of Patent: Apr. 14, 2009

(54) LIGHT EMITTING ELEMENT MOUNTING MEMBER, AND SEMICONDUCTOR DEVICE USING THE SAME

(75) Inventors: Sadamu Ishidu, Itami (JP); Kenjiro Higaki, Itami (JP); Takashi Ishii, Itami (JP); Yasushi Tsuzuki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 19 days.

(21) Appl. No.: 10/546,777

(22) PCT Filed: Mar. 15, 2004

(86) PCT No.: PCT/JP2004/003443

§ 371 (c)(1),
(2), (4) Date: Aug. 24, 2005

(87) PCT Pub. No.: WO2004/084319

PCT Pub. Date: Sep. 30, 2004

(65) Prior Publication Data

US 2006/0198162 A1 Sep. 7, 2006

(30) Foreign Application Priority Data

Mar. 18, 2003 (JP) .............................. 2003-074036

(51) Int. Cl.
*H01L 33/00* (2006.01)
(52) U.S. Cl. .............................. 257/98; 257/79; 257/99
(58) Field of Classification Search .................. 257/79, 257/94–99; 372/43.01, 50.23; 362/613, 362/623, 341, 345, 347–350, 800
See application file for complete search history.

(56) References Cited

U.S. PATENT DOCUMENTS 5,760,479 A * 6/1998 Yang et al. .................. 257/778

(Continued)

FOREIGN PATENT DOCUMENTS

JP 02-056955 B2 2/1990

(Continued)

OTHER PUBLICATIONS

International Search Report for PCT/JP 2004/003443 mailed Jun. 15, 2004.

(Continued)

*Primary Examiner*—M. Wilczewski
*Assistant Examiner*—Paul E Patton
(74) *Attorney, Agent, or Firm*—Darby & Darby P.C.

(57) ABSTRACT

The object of the present invention is to provide a light-emitting element mounting member and a semiconductor device using the same that is easy to process and that allows adequate heat dissipation.

A light-emitting element mounting member 200 includes: a substrate 2 including an element mounting surface 2a mounting a semiconductor light-emitting element 1 and first and second conductive regions 21, 22 disposed on the element mounting surface 2a and connected to the semiconductor light-emitting element 1; a reflective member 6 including a reflective surface 6a defining an internal space 6b for housing the semiconductor light-emitting element 1 and containing a metal disposed on the element mounting surface 1a; and a metal layer 13 disposed on the reflective surface 6a. The reflective surface 6a is sloped relative to the element mounting surface 2a so that a diameter of the internal space 6b is greater away from the element mounting surface 2a.

14 Claims, 6 Drawing Sheets

U.S. PATENT DOCUMENTS

| | | | |
|---|---|---|---|
| 6,495,861 B1 * | 12/2002 | Ishinaga | 257/99 |
| 6,781,166 B2 * | 8/2004 | Lieber et al. | 257/211 |
| 7,019,335 B2 * | 3/2006 | Suenaga | 257/99 |
| 7,157,744 B2 * | 1/2007 | Palmteer et al. | 257/98 |
| 2002/0084462 A1 * | 7/2002 | Tamai et al. | 257/79 |
| 2002/0105268 A1 | 8/2002 | Schliep et al. | |
| 2003/0116769 A1 | 6/2003 | Song et al. | |
| 2004/0041159 A1 * | 3/2004 | Yuri et al. | 257/79 |
| 2004/0183081 A1 * | 9/2004 | Shishov et al. | 257/79 |
| 2004/0211970 A1 * | 10/2004 | Hayashimoto et al. | 257/98 |
| 2005/0093116 A1 * | 5/2005 | Palmteer et al. | 257/676 |

FOREIGN PATENT DOCUMENTS

| | | |
|---|---|---|
| JP | 11-345999 A | 12/1999 |
| JP | 2002-232017 A | 8/2002 |
| JP | 2003-17755 A | 1/2003 |
| JP | 2003008074 | 1/2003 |
| JP | 2003-46137 A | 2/2003 |
| JP | 2004-134699 A | 4/2004 |
| WO | WO-01/45180 A1 | 6/2001 |
| WO | 02/089219 A1 | 11/2002 |

OTHER PUBLICATIONS

PCT Notification of Transmittal of Copies of Translation of the International Preliminary Report on Patentability (Chapter I or Chapter II of the Patent Cooperation Treaty) mailed Nov. 17, 2005.

* cited by examiner

LIGHT EMITTING ELEMENT MOUNTING MEMBER, AND SEMICONDUCTOR DEVICE USING THE SAME

CROSS-REFERENCE TO PRIOR APPLICATION

This is a U.S. National Phase application under 35 U.S.C. §371 of International Patent Application No. PCT/JP2004/003443 filed Mar. 15, 2004, and claims the benefit of Japanese Patent Application No. 2003-074036, filed March 18, 2003, both of which are incorporated by reference herein. The International Application was published in Japanese on Sep. 30, 2004 as WO 2004/084319 A1 under PCT Article 21(2).

TECHNICAL FIELD

The present invention relates to a light-emitting element mounting member and a semiconductor device using the same. More specifically, the present invention relates to a light-emitting mounting element for mounting a light-emitting diode, a semiconductor laser, or the like and a semiconductor device using the same.

BACKGROUND ART

An example of a conventional member for mounting semiconductor light-emitting elements is described in Japanese Laid-Open Patent Publication Number 2002-232017.

In the semiconductor mounting member described in this publication, a substrate and a ceramic window frame surrounding a light-emitting element is formed from a ceramic having as its main component aluminum oxide, aluminum nitride, or the like.

With the increase in output in light-emitting elements in recent years, there has also been an increase in heat generated by semiconductor light-emitting elements. When a ceramic having aluminum oxide as its main component (hereinafter referred to also as alumina) is used in the substrate and the window frame, adequate heat dissipation is not possible, leading to increased temperature.

Furthermore, if aluminum nitride, which has high thermal conductivity, is used, the raw material is more expensive and harder to process than alumina. Furthermore, if a metallized layer is formed on the surface, a metallized layer having W or Mo must generally be formed first. In such cases, a method is used in which a metal paste having W or Mo as its main component is first applied to a green sheet and then this is fired together with the main aluminum nitride ceramic unit (co-fired metallizing). With this method, however, thermal deformation and the like take place during firing, making it difficult to precisely form a metallized layer with a fine pattern, e.g., of less than 100 microns.

DISCLOSURE OF INVENTION

The object of the present invention is to overcome the problems described above and to provide a light-emitting element mounting member and semiconductor device that uses the same that has high thermal conductivity and that is easy to process.

The present inventors performed various investigations regarding light-emitting element mounting members that adequately dissipate heat generated by semiconductor light-emitting elements and that are easy to process. As a result, it was found that preferable characteristics can be obtained by using a mounting member with high thermal conductivity by including metal in a reflective member.

In order to achieve the object described above, a light-emitting element mounting member according to the present invention includes: a substrate including an element mounting surface mounting a semiconductor light-emitting element and first and second conductive regions disposed on the element mounting surface and connected to the semiconductor light-emitting element; a reflective member including a reflective surface defining an internal space for housing the semiconductor light-emitting element and containing a metal disposed on the element mounting surface; and a metal layer disposed on the reflective surface. The reflective surface is sloped relative to the element mounting surface so that a diameter of the internal space is greater away from the element mounting surface.

In a light-emitting element mounting member formed in this manner, the substrate serves as a high thermal conductivity member, thus allowing adequate dissipation of the heat generated by the semiconductor light-emitting element. Furthermore, since the reflective member contains metal, processing is made easier compared to a structure in which the reflective member is formed from ceramic. This makes it possible to provide a light-emitting element mounting member that is easier to process.

Also, since the reflective member contains metal, the bond with the metal layer disposed on the reflective surface of the reflective member improves. As a result, a light-emitting element mounting member that is easy to produce can be provided.

It would be preferable for the light-emitting element mounting member to further include a bonding layer bonding the element mounting surface and the reflective member. A heat resistance temperature of the bonding layer is at least 300 deg C. The bonding layer melts at a temperature of no more than 700 deg C. and bonds the element mounting surface and the reflective member. In this case, since the bonding layer has a heat resistance temperature of at least 300 deg C., the bonding layer can prevent peeling of the substrate and the reflective member and is practical even if the temperature when the semiconductor light-emitting element is mounted on the light-emitting element mounting member is 250-300 deg C. Thus, a highly reliable light-emitting element mounting member can be obtained. Furthermore, since the bonding temperature is no more than 700 deg C., if metallized patterns formed from Au, Ag or Al or the like are formed on the surface of the substrate, degradation of the metallized patterns can be prevented. Since the heat resistance temperature of these metallized patterns are generally no more than 700 deg C., the bonding can be performed without degradation of the metallized patterns by bonding at a temperature of no more than 700 deg C.

More preferably, the substrate is insulative, first and second through-holes are formed on the substrate, the first conductor region is formed at the first through-hole, and the second conductor region is formed at the second through-hole. In this case, since the first and second conductor regions extend from the surface of the substrate on which the element mounting surface is formed to the opposite surface, electrical power can be supplied to the first and the second conductor regions from the opposite surface. More preferably, a minimum formation dimension of metal film patterns of the first and/or the second conductor region is at least 5 microns and less than 100 microns. As a result, light-emitting elements can be mounted using the flip-chip method. More preferably, the dimension is less than 50 microns. The minimum formation dimension of patterns here refers to the minimum widths, minimum distances between patterns, and the like in the metallized patterns.

A semiconductor device according to the present invention includes a light-emitting element mounting member as described in any of the above; and a semiconductor light-emitting element mounted on the element mounting surface. The semiconductor light-emitting element includes a main surface facing the element mounting surface and the substrate includes a bottom surface positioned opposite from the element mounting surface. A ratio H/L between a distance H from the bottom surface to the element mounting surface and a distance L along a direction of a long side of the main surface of the semiconductor light-emitting element is at least 0.3.

In this case, since the ratio H/L between the long-side length L and the distance H from the bottom surface to the element mounting surface is optimized, a semiconductor device with high heat dissipation can be obtained. If the ratio H/L between the long-side length L and the distance H from the bottom surface to the element mounting surface is less than 0.3, the distance H from the bottom surface to the element mounting surface becomes too small relative to the long-side length L, preventing adequate heat dissipation.

It would be preferable for an electrode to be disposed on the main surface side of the semiconductor light-emitting element and electrically connected to the first and/or the second conductor region. In this case, since the electrode is disposed on the main surface side and the electrode is directly connected electrically to the first and/or the second conductor region, the heat generated by the light-emission layer, which is the section of the semiconductor light-emitting element that especially generates heat, is transmitted directly to the substrate by way of the electrode. As a result, the heat generated by the light-emission layer is efficiently dissipated to the substrate, providing a light-emitting element mounting member with superior cooling properties. It would also be preferable for the main surface to have an area of at least 1 $mm^2$.

BRIEF DESCRIPTION OF THE DRAWINGS

FIG. 1 shows cross-section drawings of a light-emitting element according to a first embodiment of the present invention and a cross-section drawing of a semiconductor device using the same.

FIG. 3B shows sample outlines shapes of a main surface of the element.

BEST MODE FOR CARRYING OUT THE INVENTION

The embodiments of the present invention will be described, with references to the figures. In the embodiments below, identical or similar elements will be assigned like numerals and overlapping descriptions will be omitted.

First Embodiment

Figure 1A:
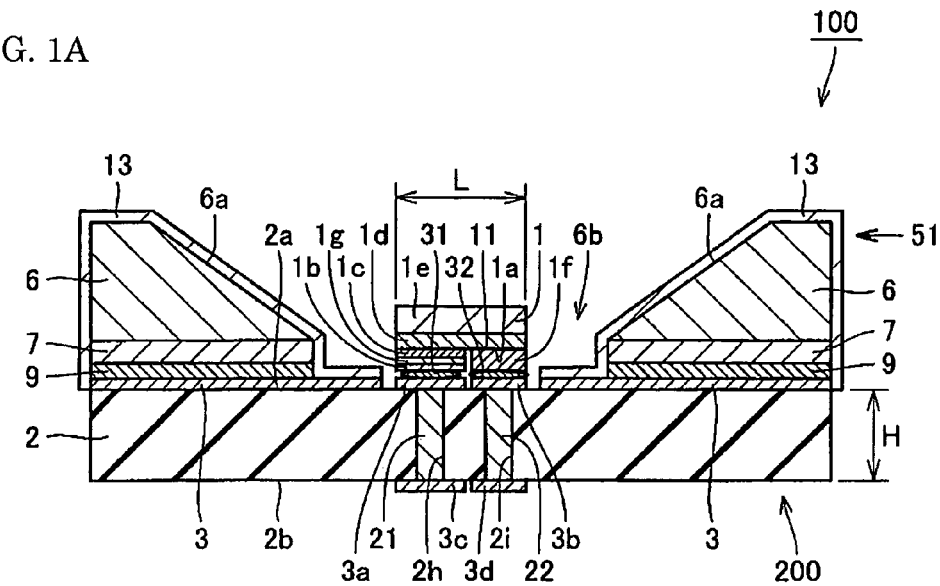
FIG. 1A is a cross-section drawing of a semiconductor device according to one aspect.
Figure 1B:
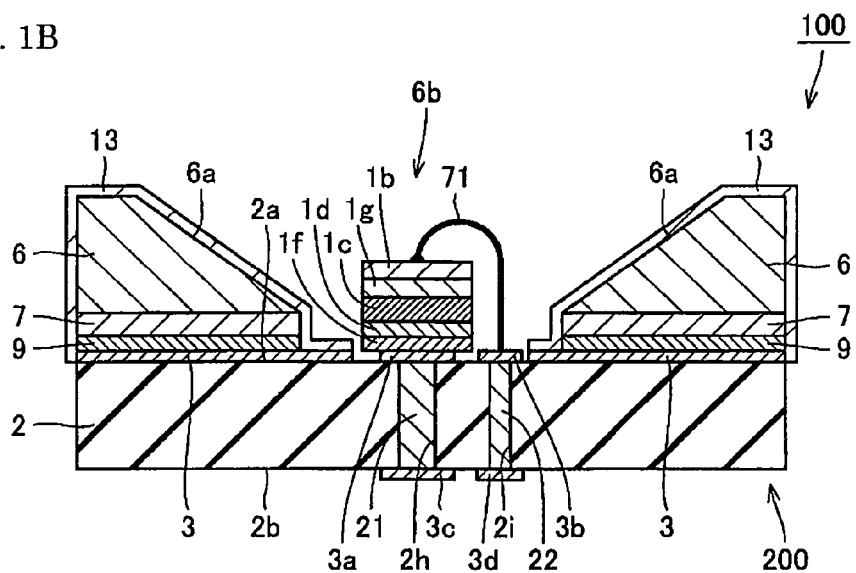
FIG. 1B is a cross-section drawing of a semiconductor device according to another aspect.
Figure 2:
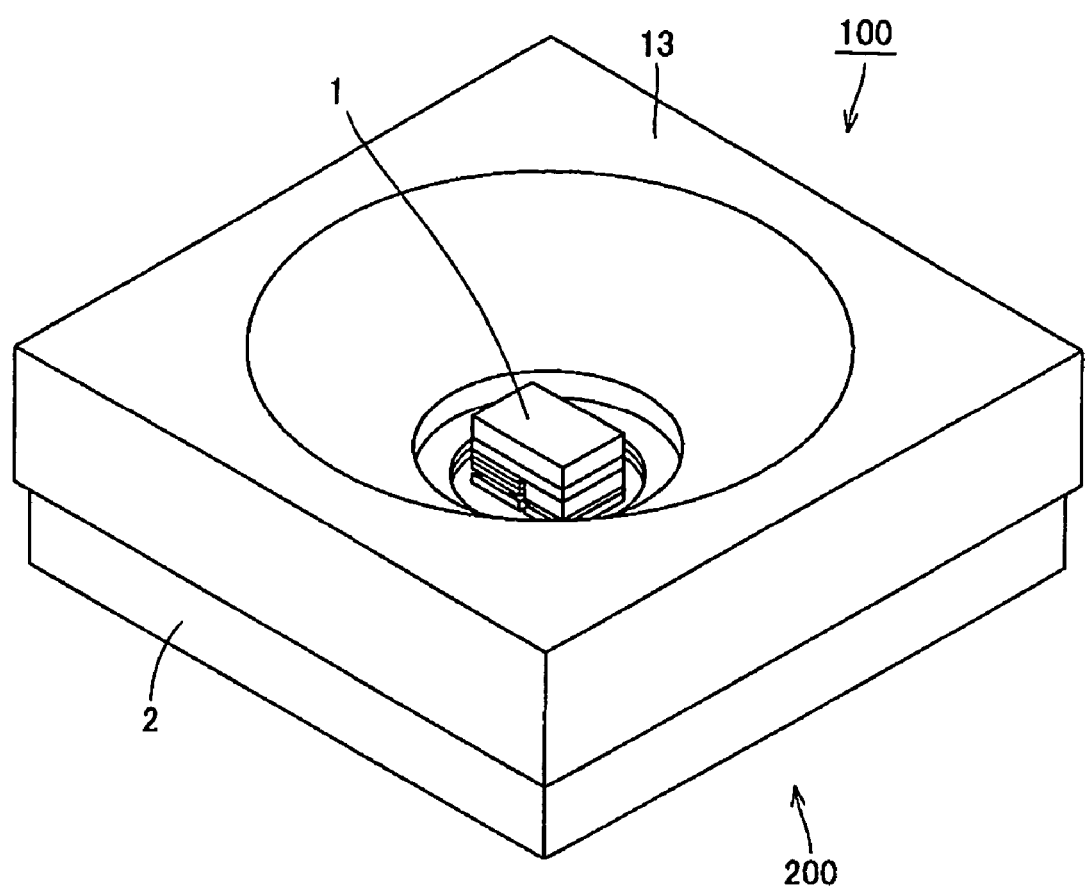
FIG. 2 is a perspective drawing of a light-emitting element mounting member and semiconductor device shown in FIG. 1.

FIG. 1 is a cross-section drawing of a light-emitting element mounting member according to a first embodiment of the present invention and a semiconductor device using the same. FIG. 1A is a cross-section drawing of a semiconductor device according to one aspect. FIG. 1B is a cross-section drawing of a semiconductor device according to another aspect. FIG. 2 is a perspective drawing of the semiconductor device shown in FIG. 1A. FIG. 3 is a perspective drawing of the semiconductor light-emitting element shown in FIG. 1A. As shown in FIG. 1A, FIG. 2, and FIG. 3, a semiconductor device 100 according to the first embodiment of the present invention includes: a light-emitting element mounting member 200; and a semiconductor light-emitting element 1 mounted on an element mounting surface 2a. The semiconductor light-emitting element 1 includes a main surface 1a facing the element mounting surface 2a. In this example, the main surface 1a is formed as a rectangle including a longer first side 11 and a shorter second side 12. A substrate 2 includes a bottom surface 2b opposite from the element mounting surface 2a. A distance H from the bottom surface 2b to the element mounting surface 2a and a length L of the first side 11 have a ratio H/L of at least 0.3.

The light-emitting element mounting member 200 includes the substrate 2 and a reflective surface 6a and is equipped with a reflective member 6 and a metal layer 13. The substrate 2 includes: the mounting surface 2a for mounting a semiconductor light-emitting element 1; and first and second conductor regions 21, 22 disposed on the element mounting surface 2a and connected to the semiconductor light-emitting element 1. The reflective surface 6a defines an inner space 6b which houses the semiconductor light-emitting element 1. The reflective member 6 is disposed on the element mounting surface 2a and contains metal. The metal layer 13 is disposed on the reflective surface 6a. The reflective surface 6a is sloped relative to the element mounting surface 2a so that the diameter of the inner space 6b is larger away from the element mounting surface 2a.

The light-emitting element 200 is further equipped with a bonding layer 9 that joins the element mounting surface 2a and the reflective member 6. The bonding layer 9 has a temperature rating of at least 300 deg C., and the bonding layer 9 melts at a temperature of no more than 700 deg C. to bond the element mounting surface 2a and the reflective member 6.

The substrate 2 is insulative and is formed with first and second through-holes 2h, 2i. The first conductor region 21 is disposed on the first through-hole 2h, and the second conductor region 22 is disposed on the second through-hole 2i. Also, as described above, in the semiconductor device, the minimum pattern width and the minimum distance between patterns for the metal film formed on the element mounting surface at the first and/or second conductor regions 21, 22 are kept within the range of at least 5 microns and less than 10 microns. This allows flip-chip light-emitting elements and the like to be mounted. A range of at least 10 microns and less than 50 microns is preferable. In particular, smaller distances are preferable between patterns in the first and second conductor regions 21, 22 as long as bad connections are avoided. The reason for this is that reflection efficiency improves when a larger area is metallized. At less than 5 microns, bad connections tend to form.

Electrode layers 1b and 1f are disposed on the main surface 1a of the semiconductor light-emitting element 1 and are connected to the first and second conductor regions 21, 22. The area of the main surface 1a is at least 1 mm².

The substrate 2 is electrically insulative and formed from a material with good heat conductivity. The material can be selected based on the usage environment. For example, the material can be ceramics having as the main component aluminum nitride (AlN), silicon nitride ($Si_3N_4$), aluminum oxide ($Al_2O_3$), boron nitride (BN), silicon carbide (SiC), or the like. Alternatively, a material that has as the main component electrically insulative silicon (Si), or a composite material or a combination of the above can be used.

The substrate 2 acts as a heat sink that dissipates heat. Thus, higher heat conduction is preferable, and a heat conduction rate of at least 140 W/m·K would be preferable, with a rate of at least 170 W/m·K being more preferable. If a periodic table group III-V compound semiconductor light-emitting element or a group II-VI compound semiconductor light-emitting element is to be used for the semiconductor light-emitting element 1, it would be preferable for the thermal expansion coefficient (linear expansivity) to be at least $3.0 \times 10^{-6}$/K and no more than $10 \times 10^{-6}$/K in order to match the thermal expansion coefficient of the light-emitting element.

Au films 3a, 3b, 3 are formed on the element mounting surface 2a. The Au film 3 serves to improve the bond between the bonding layer 9 and the substrate 2. For this reason, the Au film 3 is formed from a material that improves the bond between the bonding layer 9 and the substrate 2. The Au film 3 is used since, in this embodiment, nitride aluminum, a ceramic, is used for the substrate 2, and Au—Ge is used for the bonding layer 9. If the material used in the bonding layer is changed, then it would be possible to form the Au films 3, 3a, 3b as layers having aluminum as the main component or silver as the main component. The Au films 3, 3a, 3b are formed by plating, vapor deposition, or the like. It would also be possible to interpose an intermediate layer to improve the bond, e.g., a titanium layer or a platinum layer, between the Au films 3, 3a, 3b and the element mounting surface 2a.

Examples of intermediate layers disposed between the element mounting surface 2a and the Au films 3, 3a, 3b include Ni, Ni—Cr, Ni—P, Ni—B, and NiCo. These can be formed by plating, vapor deposition, or the like. If vapor deposition is to be performed, materials such as Ti, V, Cr, Ni, NiCr alloy, Zr, Nb, Ta can be used. It would also be possible to stack plated layers and/or vapor deposition layers. It would be preferable for the thickness of the intermediate layer to be at least 0.01 mm and no more than 5 mm, and more preferably at least 0.1 mm and no more than 1 mm.

In this example, it would also be possible to form an intermediate layer, e.g., formed from a Ti/Pt layered film, between the substrate 2 and the Au films 3, 3a, 3b. The film containing Ti in this stacked film serves as a bonding layer to improve bonding with the substrate 2 and is formed so that it comes into contact with the upper surface of the substrate 2. The material for the bonding layer does not need to be titanium and can be, for example, vanadium (V), chrome (Cr), nickel-chrome alloy (NiCr), zirconium (Zr), niobium (Nb), tantalum (Ta), or a compound of thereof.

Also, the platinum (Pt) film in the Ti/Pt stacked film is a diffusion barrier layer and is formed on the upper surface of the Ti film. The material does not need to be platinum (Pt), and can be palladium (Pd), nickel-chrome alloy (NiCr), nickel (Ni), molybdenum (Mo), copper (Cu), or the like.

The Ti/Pt stacked film and the Au films described above are collectively referred to as a metallized film. The metallized film can be formed using conventional film-forming methods described above. For example, vapor deposition, sputtering, or plating can be used. The patterning of the Ti/Pt stacked film and the Au films can be performed using metal masking, dry etching, chemical etching, or lift-off involving photolithography. These methods are suitable when forming fine patterns restricted to less than 100 microns or less than 50 microns.

It would be preferable for the thickness of the titanium (Ti) film in the Ti/Pt stacked film to be at least 0.01 mm and no more than 1.0 mm, and the thickness of the platinum (Pt) film to be at least 0.01 mm and no more than 1.5 mm.

The thickness of the substrate 2, i.e., the distance H from the bottom surface 2b to the element mounting surface 2a, can be set up according to the dimensions of the semiconductor element 1, but, as an example, the distance H can be set to at least 0.3 mm and no more than 10 mm.

The semiconductor light-emitting element 1 is disposed so that it comes into contact with the Au films 3a, 3b. The semiconductor light-emitting element 1 can be formed from a group II-VI compound semiconductor light-emitting element or a group III-V compound semiconductor light-emitting element. The group II elements here include zinc (Zn) and cadmium (Cd). The group III elements include boron (B), aluminum (Al), gallium (Ga), and indium (In). The group V elements include nitrogen (N), phosphorous (P), arsenic (As), and antimony (Sb). The group VI elements include oxygen (O), sulfur (S), selenium (Se), and tellurium (Te). The semiconductor light-emitting element 1 can be formed as a compound semiconductor that is GaAs-based, InP-based, GaN-based, or the like.

Through-holes 2h, 2i are formed as via holes on the substrate 2. The conductors used to fill the through-holes 2h, 2i form the first and second conductor regions 21, 22. The main component for the conductor (via fill) is preferably a metal with a high melting point, particularly tungsten (W) or molybdenum (Mo). It would also be possible to further include a transitional metal such as titanium (Ti) or a glass component or substrate material (e.g., aluminum nitride (AlN)). Also, the through-holes 2h, 2i do not need to be filled with conductor if the inner surfaces thereof are metallized by plating or the like.

The surface roughness of the element mounting surface 2a is preferably no more than 1 micron Ra and more preferably no more than 0.1 micron Ra. The flatness is preferably no more than 5 microns and more preferably 1 micron. If the Ra exceeds 1 micron or the flatness exceeds 5 microns, gaps tend to form between the semiconductor light-emitting element 1 and the substrate 2 during bonding, leading to reduced cooling of the semiconductor light-emitting element. Surface roughness Ra and the flatness are defined according to JIS standards (JIS B0601 and JIS B0621, respectively).

The compound semiconductors described above are examples of materials for the semiconductor light-emitting element 1 of the present invention, but it would also be possible to stack these layers or bulks on a substrate such as a sapphire substrate. The light-emitting section can be at either the top surface or the bottom surface. In this embodiment, the light-emitting layer 1c is disposed on the substrate side. Since the light-emitting layer 1c, which is the heat-generating section, is disposed closer to the substrate, heat dissipation for the semiconductor element can be improved.

A metallized layer, e.g., an electrode layer and insulation layer formed from silicon oxide film ($SiO_2$) can be formed on the surface of the semiconductor light-emitting element 1 disposed on the substrate 2. It would be preferable for the thickness of the gold (Au) serving as the electrode layer to be at least 0.1 microns and no more than 10 microns.

The semiconductor light-emitting element 1 includes: a base unit 1e formed from sapphire or the like; a semiconductor layer 1d in contact with the base unit 1e; a light-emitting layer 1c in contact with a section of the semiconductor layer 1d; a semiconductor layer 1g in contact with the light-emitting layer 1c; an electrode layer 1b in contact with the semiconductor layer 1g; and an electrode layer 1f in contact with the semiconductor layer 1d.

The structure of the semiconductor light-emitting element 1 is not restricted to what is shown in FIG. 1A. For example, it would also be possible to have a structure as shown in FIG. 1B in which the electrode layer 1f, the semiconductor layer 1d, the light-emitting layer 1c, the semiconductor layer 1g, and the electrode layer 1b are stacked. In this case, electrodes are present on both the front and back of the semiconductor light-emitting element 1, and the electrode layer 1b is connected by an Au bonding line 71 to the Au film 3b. In FIG. 1B, only the first conductor region is directly bonded to the semiconductor light-emitting element 1.

Figure 3A:
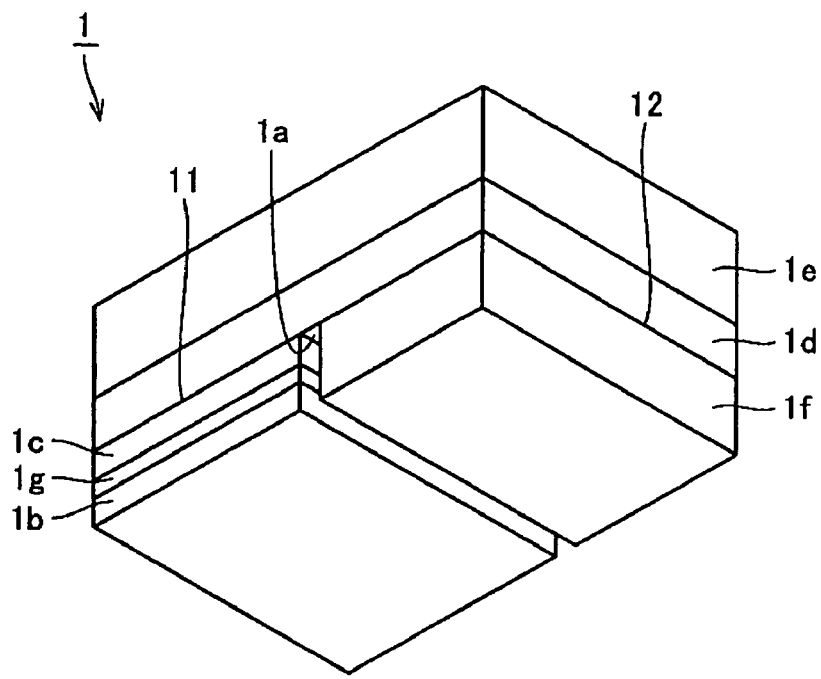
FIG. 3A is a perspective drawing of the semiconductor light-emitting element shown in FIG. 1.
Figure 3A:
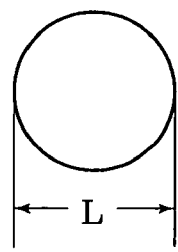
Figure 3A:
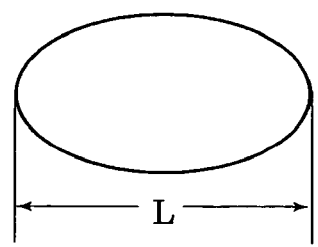
Figure 3A:
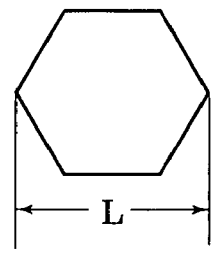
Figure 3A:
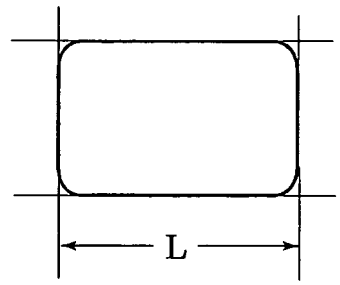
Figure 3A:
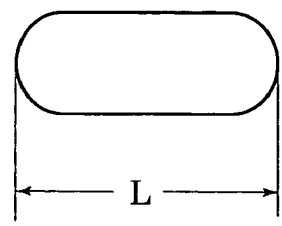
Figure 5:
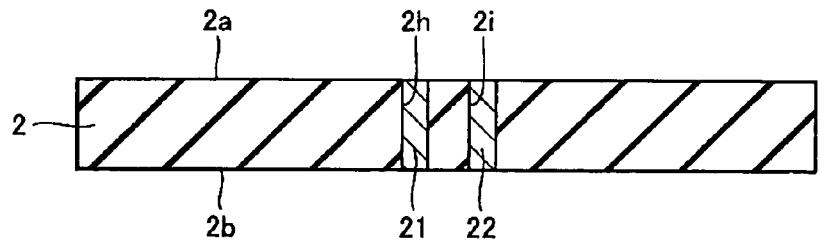
FIG. 5 is a cross-section drawing showing a first step of the method for making the semiconductor device shown in FIG. 1 through FIG. 3.

As shown in FIG. 3A, of the sides that form the main surface 1a, the first side 11 is the long side and the second side 12 is the short side. However, it would also be possible to have the first side 11 be the short side and the second side 12 be the long side. In this example, the main surface of the semiconductor light-emitting element is rectangular, so the long side corresponds to the length L along the direction of the long side. The first side 11 extends roughly perpendicular to the direction in which the light-emitting layer 1c extends. The second side 12 extends roughly parallel to the light-emitting layer 1c. Also, the first side 11 and the second side 12 can be roughly the same length. If the first side 11 and the second side 12 are roughly the same length, the first side 11 is treated as the long side. Furthermore, if the main surface 1a is not rectangular, e.g., if the corners are rounded, the long side is defined based on an approximation of the main surface 1a to a rectangle. Also, while this applies to other embodiments of the present invention, if the main surface 1a is rectangular as in this example, the opposite surface will generally be roughly the same shape, but this does not need to be the case. Also, as shown in the examples of main surface shapes in FIG. 3B, the main surface can be non-rectangular. The length along the direction of the long side of the main surface of the semiconductor element of the present invention is measured from the outline of the image projected in a direction perpendicular to the main surface. FIG. 3B1 through FIG. 3B5 are examples of this, and the indicated lengths L are the lengths along the direction of the long side. For example, if the shape is a circle or a square, the length would be the diameter or one of the sides, respectively. If the shape is an ellipse, the length of the major axis is used.

In this example, the long-side length L of the semiconductor light-emitting element 1 corresponds to the length of the first side 11. It would be preferable for the ratio H/L between this length and the distance H from the bottom surface 2b to the element mounting surface 2a to be at least 0.3. It would be more preferable for the ratio H/L to be at least 4.5 and no more than 1.5. It would be even more preferable for the ratio H/L to be at least 0.5 and no more than 1.25.

The reflective member 6 is disposed so that it surrounds the semiconductor light-emitting element 1. A material having a thermal coefficient close to the aluminum nitride forming the substrate 2 is used. For example, the reflective member can have a thermal expansion coefficient of at least $3\times10^{-6}$/K and no more than $7\times10^{-6}$/K. It would be preferable for the reflective member 6 to have a thermal expansion coefficient of at least $4\times10^{-6}$/K and no more than $6\times10^{-6}$/K. Furthermore, it would be preferable in terms of ease of processing to use a metal or alloy or a metal composite material. More specifically, the reflective member 6 is formed from a Ni—Co—Fe alloy, with the main components being Ni with a proportion of 29% by mass, Co with a proportion of 18% by mass, and Fe with a proportion of 53% by mass.

The reflective surface 6a is a tapered, sloped surface disposed on the reflective member 6. The reflective surface 6a forms an angle relative to the element mounting surface 2a preferably in the range of 30 deg to 70 deg and more preferably in the range of 40 deg to 60 deg. A plating layer 7 formed from Ni/Au is disposed on the reflective member 6. This plating layer is used when an Au-based solder (Au—Ge) is to be used for the bonding layer 9 and serves to increase the bonding strength between the bonding layer 9 and the reflective member 6. A plating layer 7 can also be disposed along the entire perimeter of the reflective member 6.

A metal layer 13 is formed to cover the surface of the reflective member 6. The metal layer 13 is formed by plating or vapor deposition and serves to let out light emitted from the semiconductor light-emitting element 1.

The reflective surface 6a defines the inner space 6b, and the inner space 6b forms a cone shape. The circular cone shape shown in FIG. 2 is an example. However, it would also be possible for the inner space 6b to be formed as an angular cone shape such as a four-side cone or a triangular cone. Also, the reflective surface 6a can be formed as a curved surface such as a parabolic surface.

Figure 4:
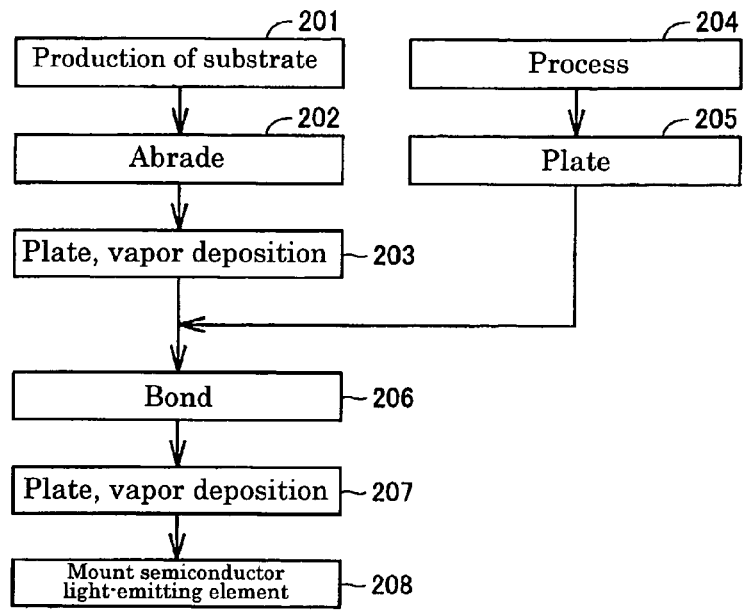
FIG. 4 is a flowchart for the purpose of describing a method for making the semiconductor device shown in FIG. 1.

Next, a method for making a semiconductor device 100 shown in FIG. 1 through FIG. 3 will be described. FIG. 4 is a flow chart illustrating the method for making the semiconductor device shown in FIG. 1. FIG. 5 through FIG. 12 are figures for the purpose of describing the method for making the semiconductor device shown in FIG. 3.

Referring to FIG. 4 through FIG. 5, a substrate is produced first (step 201). Since the length and width of this type of substrate 2 is very small, on the order of a few millimeters, a substrate base with length and width of approximately 50 mm is produced and the through holes 2h, 2i are formed on the substrate base material. The first and second conductive regions 21, 22 are formed on the through-holes 2h, 2i. Then, the substrate base is finely cut to a predetermined size. The size of the substrate base in this method can be, for example, 50 mm in width, 50 mm in length, and 0.3 mm in thickness. The sintered aluminum nitride, which is the substrate material, is made using a standard method. The cutting and splitting the substrate base to a predetermined size can, for example, be performed after bonding (step 206) or at another step.

Next, the surface of the substrate from the second step is abraded (step 202). The surface roughness of the abraded substrate surface is preferably an Ra of no more than 1.0 microns and more preferably no more than 0.1 microns. The abrading can be performed using a standard method such as with a grinder, sand blasting, sand paper, or other methods using abrasive particles.

Figure 6:
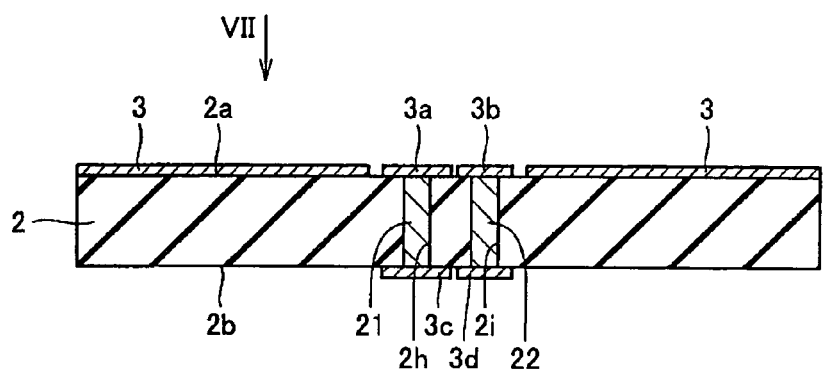
FIG. 6 is a cross-section drawing showing a second step of the method for making the semiconductor device shown in FIG. 1 through FIG. 3.
Figure 7:
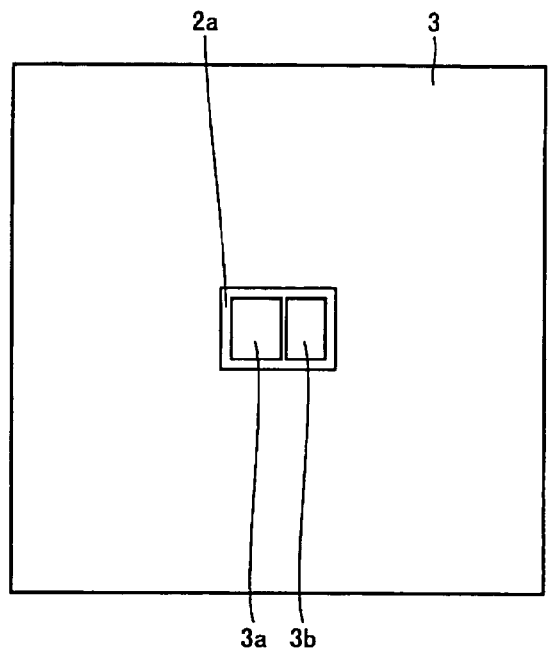
FIG. 7 is a plan drawing of a substrate as seen from the direction indicated by the arrow VII in FIG. 6.

As shown in FIG. 4, FIG. 6, and FIG. 7, an Au film is formed using plating or vapor deposition on the element mounting surface 2a and the bottom surface 2b of the substrate 2 (step 203). More specifically, in the case of this embodiment, for example, Ti/Pt is first vaporized to serve as a backing layer and an Au film is vaporized on this. The vapor deposition method can, for example, involve photolithography, where resist film is formed on the sections of the substrate outside of the regions at which the films are to be formed, with the layers being formed on the resist film and the substrate. First, the Ti film serving as the bonding layer is vaporized, followed by the Pt film serving as the diffusion barrier layer, and then finally the Au film, which is the electrode layer, is vaporized as the outermost layer. Then, lift-off of the resist is performed. More specifically, the resist film formed in the above step is removed along with the films from the bonding layer, the diffusion barrier layer and the electrode layer using a resist removal fluid. As a result, as shown in FIG. 6 and FIG. 7, the Au films 3, 3a, 3b, 3c, 3d are formed in predetermined patterns on the substrate. The Au films 3a, 3b are formed at the central section of the substrate, and the Au film 3 is formed to surround these films. By forming the metal films using a method such as photolithography as described above, patterns with pattern dimensions of no more than 100 microns can be formed, and it would also be possible to form patterns with dimensions of no more than 50 microns. The dimensions refer to the smallest distance between patterns, the pattern widths, and the like. As a result, it is possible to mount peripheral members that require high-precision dimensions such as flip-chip semiconductor light-emitting elements.

Figure 8:
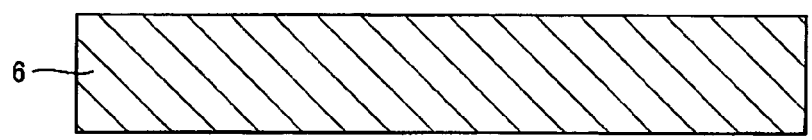
FIG. 8 is a cross-section drawing showing a third step of the method for making the semiconductor device shown in FIG. 1 through FIG. 3.

The reflective member 6 is prepared, as shown in FIG. 4 and FIG. 8. As described above, the reflective member 6 is formed from a material with a thermal expansion coefficient close to that of aluminum nitride, e.g., an alloy with low thermal expansion formed from Ni—Co—Fe.

Figure 9:
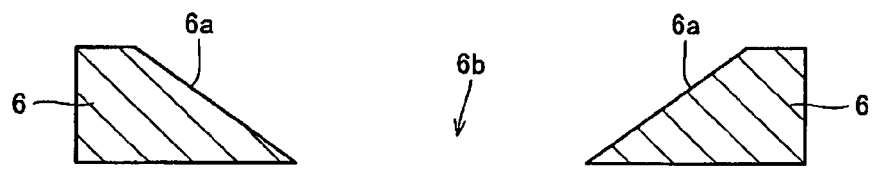
FIG. 9 is a cross-section drawing showing a fourth step of the method for making the semiconductor device shown in FIG. 1 through FIG. 3.

As shown in FIG. 4 and FIG. 9, the reflective surface 6a is formed by processing the reflective member 6 (step 204). The reflective surface 6a expands outward, forming an angle (e.g., 45 deg) relative to the widest surface of the reflective member 6.

Figure 10:
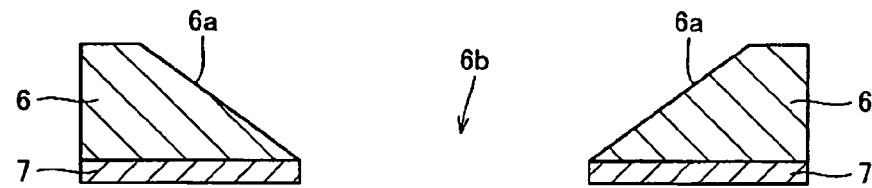
FIG. 10 is a cross-section drawing showing a fifth step of the method for making the semiconductor device shown in FIG. 1 through FIG. 3.

As shown in FIG. 4 and FIG. 10, a plating layer 7 is formed on the reflective member 6 (step 205). The plating layer 7 is an Ni/Au stack. Forming the plating layer 7 along the entire perimeter of the reflective member 6 is acceptable.

Figure 11:
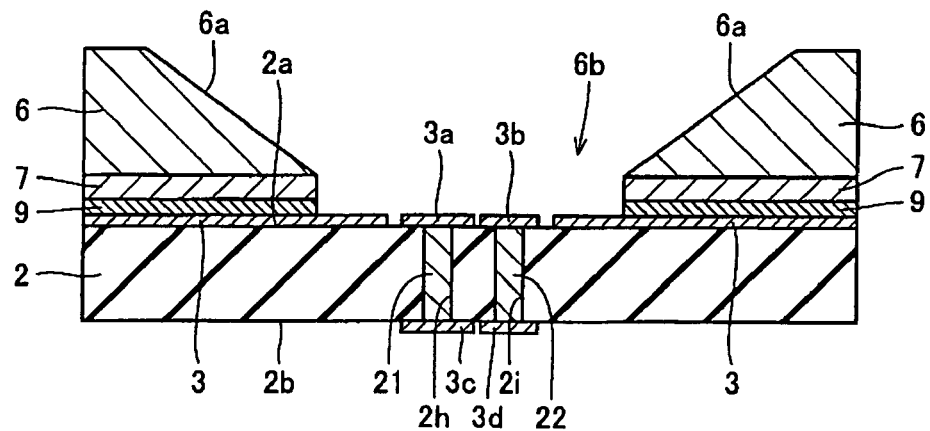
FIG. 11 is a cross-section drawing showing a sixth step of the method for making the semiconductor device shown in FIG. 1 through FIG. 3.

As shown in FIG. 4 and FIG. 11, the reflective member 6 and the substrate 2 are connected (step 206). The bonding layer 9 can be solder, sealing/coating glass, heat-resistant adhesive, or the like, and connects the reflective member and the substrate at a temperature that does not exceed the temperature tolerance of the metallized patterns. An example of solder is Au—Ge solder. The use of solder is preferable due to bonding strength and its Pb-free content. Examples of heat-resistant adhesives include inorganic adhesives and resin adhesives. An example of solder is Ag-based solder. Examples of inorganic adhesives include glass and ceramic adhesives. Examples of resin adhesives include polyimide resins, polyamide-imide resin, epoxy resin, acrylic epoxy resin, and liquid-crystal polymer resin.

Figure 12:
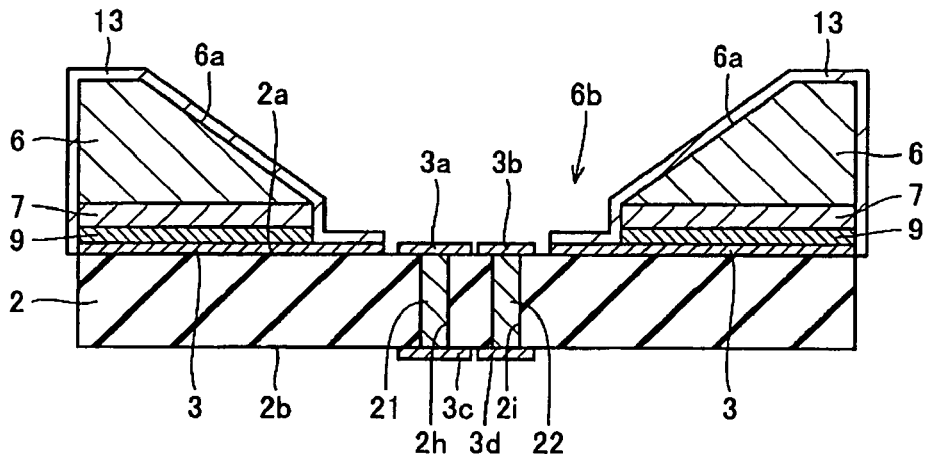
FIG. 12 is a cross-section drawing showing a seventh step of the method for making the semiconductor device shown in FIG. 1 through FIG. 3.

As shown in FIG. 4 and FIG. 12, the metal layer 13 is formed, e.g., through plating or vapor deposition (step 207). The metal layer 13 serves to let out light emitted from the semiconductor light-emitting element, and it would be preferable for the outermost layer to be formed from a material with a high reflectivity, e.g., Ag, Al, or metals with these elements as main components. If the reflectivity of the reflective member 6 itself is high, the metal layer 13 can be eliminated. Also, in some cases, the metal layer 13 on the Au film 3a, 3b where the element is mounted may be eliminated in order to improve the reliability of the bond with the semiconductor element.

As shown in FIG. 4 and FIG. 1, the semiconductor light-emitting element is mounted (step 208). The mounting is performed in this case using a flip-chip connection, with the light-emitting layer 1c disposed toward the substrate 2. As a result, the heat generated by the light-emitting layer 1c is transferred immediately to the substrate 2, providing good heat dissipation. Examples of members used in the connection include Sn-based solder such as Sn, Au—Sn, Ag—Sn, and Pb—Sn solder, as well as bumps formed from Au or any of these solders.

In the light-emitting element mounting member 200 and the semiconductor device 100 using the same according to the present invention as described above, the reflective member 6 contains metal. As a result, the metal layer 13 can be formed directly on the surface of the reflective member 6. Also, if the reflective member 6 is to be processed in the step shown in FIG. 9, the processing is made easy and production costs can be reduced.

Second Embodiment

Figure 13:
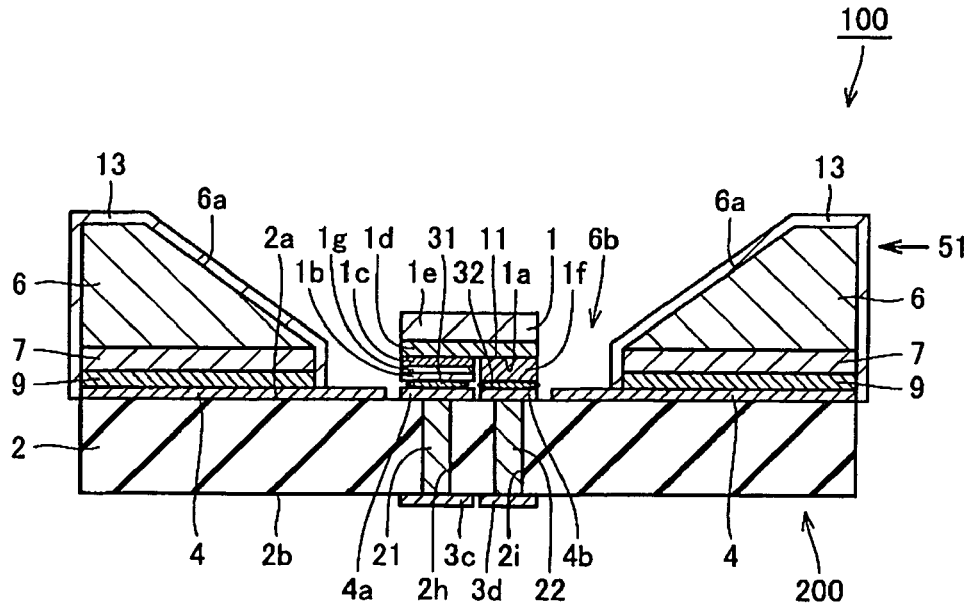
FIG. 13 is a cross-section drawing of a light-emitting element mounting member and semiconductor device using the same according to a second embodiment of the present invention.

FIG. 13 is a cross-section drawing of a light-emitting element mounting member and a semiconductor device that uses the same according to a second embodiment of the present invention. As shown in FIG. 13, in the light-emitting element mounting member 200 according to the second embodiment of the present invention, metal films 4, 4a, 4b are formed on the element mounting surface 2a, and the metal films 4, 4a, 4b are formed from Ag or Al. In this case, as shown in FIG. 13, it is possible to have the metal layer 13 formed only on the reflective member 6.

In this case, the same advantages are provided as those of the light-emitting element mounting member 200 and the semiconductor device 100 according to the first embodiment.

WORKING EXAMPLE

A detailed study into the characteristics of the bonding layer 9 bonding the substrate 2 and the reflective member 6 was performed using a working example. Referring to FIG. 1, the reflective member 6 was attached to the element mounting surface 2a of the substrate 2 formed from aluminum nitride, interposed by the bonding layer 9. The reflective member 6 is an Ni—Co—Fe alloy with an Ni proportion of 29% by mass, a Co proportion of 18% by mass, and an Fe proportion of 53% by mass. Also, the dimensions of the reflective member 6 were set to 5 mm×5 mm×1 mm (height×width×thickness).

For the bonding layer 9, the sample 1 through the sample 8 from Table 1 were used.

TABLE 1

| Sample No. | | Material for the bonding layer 9 | Bonding temperature | Heat resistance 1 | Heat resistance 2 | Strength | Electrode metallized pattern degradation (Au film 3) | Notes |
|---|---|---|---|---|---|---|---|---|
| 1 | Solder | Au—Ge 12% | 360° C. | ○ | ○ | ○ | ○ | ◎ |
| 2 | | Ag—Cu 28% | 780° C. | ○ | ○ | ○ | X | Discoloration in Au immediately after bonding; Film thickness reduced |
| 3 | | Au—Sn 20% | 280° C. | X | X | ○ | ○ | Re-melting of bonding layer when mounting |
| 4 | Glass | PbO—B$_2$O$_3$ | 450° C. | ○ | ○ | ○ | ○ | |
| 5 | | Pb free | 650° C. | ○ | ○ | ○ | ○ | |
| 6 | Adhesive | Epoxy resin | 130° C. | ○ | X | ○ | ○ | |
| 7 | | Inorganic | 140° C. | ○ | ○ | X | ○ | Adhesive layer destroyed due to impact |
| 8 | | Epoxy + inorganic | 150° C. | ○ | X | ○ | ○ | |

In Table 1, the component content percentages in the "Material for the bonding layer 9" column refer to percent by mass. These bonding layers 9 were melted at the "Bonding temperature" in Table 1 to bond the substrate 2 and the reflective member 6.

Strength, heat resistance, and deterioration of the electrode metallized patterns, were studied for the samples obtained in this manner. For strength, the strength (initial strength) when cooled to room temperature (25 deg C.) after bonding was measured. Measurements were made by applying a load to the reflective member 6 from the direction indicated by arrow 51 in FIG. 1 and determining the pressure when the reflective member 6 detaches from the substrate 2. Based on the results, an initial strength of, at least 10 MPa was determined to be good and a circle was entered in the "Strength" column. An "X" was entered for samples with initial strengths of less than 10 MPa.

To evaluate heat resistance, the bonding layer was left in an atmosphere with a temperature of 300 deg C. for one minute and for 24 hours at the same temperature. The samples in which the bonding layer 9 did not melt again or soften and for which the drop in bonding strength, as measured according to the method indicated in FIG. 1, was less than 10% was evaluated as good and a circle was entered in the "Heat resistance" column. The results from 300 deg C. for one minute was entered in the "Heat resistance 1" column and the result from the same temperature at 24 hours was entered in the "Heat resistance 2" column. For samples with bonding strength drops of 10% or more, an "X" was entered in the "Heat resistance" column. The drop in bonding strength was calculated using the formula ((A1−A2)/A1), where A1 is the initial strength and A2 is the strength at room temperature after being heated at 300 deg C.

In this specification, "a bonding temperature of at least 300 deg C." refers to when the bonding layer 9 does not re-melt or soften even after the bonding layer is kept in a 300 deg C. atmosphere for 1 minute and that has a bonding strength drop of less than 10% when measured according to the method indicated in FIG. 1. The drop in bonding strength is calculated using the formula ((A1−A2)/A1), where A1 is the initial strength (bonding strength before the layer is kept in a temperature of 300 deg C.) and A2 is the strength at room temperature after being kept in a 300 deg C. atmosphere for 1 minute.

The deterioration of the electrode metallization patterns (Au films 3, 3a, 3b) was measured as well. More specifically, visual inspections and thickness measurements were performed on the electrode metallized patterns after the light-emitting element mounting member 200 was kept in a 300 deg C. atmosphere for 24 hours. Samples in which deterioration such as discoloration did not take place for Au films 3, 3a, 3b were indicated as circles. If there was discoloration in the Au films 3, 3a, 3b or if the thickness of the Au films 3, 3a, 3b decreased, an "X" was indicated.

As shown in Table 1, good results were obtained in the samples 1, 4, 5, 6, 7, 8. The samples 1, 4, 5 provided especially good results.

All aspects of the described embodiments present examples and are not meant to be restrictive. The scope of the present invention is indicated not in the description above but by the claims of the invention and all modifications within the scope of the claims and within the scope of equivalence to these claims are covered by the present invention.

INDUSTRIAL APPLICABILITY

With the present invention, a light-emitting element mounting member and a semiconductor device that uses the same that can be easily processed and that has superior heat dissipation properties can be provided.

The invention claimed is:

1. A light-emitting element mounting member comprising:
   a substrate including an element mounting surface mounting a semiconductor light-emitting element and first and second conductive regions disposed on said element mounting surface and connected to said semiconductor light-emitting element;
   a reflective member made of metal or alloy or metal composite material including a reflective surface defining an internal space for housing said semiconductor light-emitting element disposed on said element mounting surface; and
   a metal layer disposed on said reflective surface;
   wherein:
      said substrate comprises a ceramic material and has a thermal expansion coefficient that is at least $3 \times 10^{-6}$/K and no more than $10 \times 10^{-6}$/K,
      said reflective member has a thermal expansion coefficient that is at least $3 \times 10^{-6}$/K and no more than $7 \times 10^{-6}$/K, and
      said reflective surface is sloped relative to said element mounting surface so that a diameter of said internal space is greater away from said element mounting surface.

2. A light-emitting element mounting member according to claim 1 further comprising a bonding layer bonding said element mounting surface and said reflective member wherein:
- a heat resistance temperature of said bonding layer is at least 300 deg C.; and
- said bonding layer melts at a temperature of no more than 700 deg C. and bonds said element mounting surface and said reflective member.

3. A light-emitting element mounting surface according to claim 1 wherein:
- said substrate is insulative;
- first and second through-holes are formed on said substrate;
- said first conductor region is formed at said first through-hole; and
- said second conductor region is formed at said second through-hole.

4. A semiconductor device according to claim 1 wherein a minimum formation dimension of metal film patterns of said first and/or said second conductor region is at least 5 microns and less than 100 microns.

5. A semiconductor device comprising:
- a light-emitting element mounting member according to claim 1; and
- a semiconductor light-emitting element mounted on said element mounting surface;
- wherein:
- said semiconductor light-emitting element includes a main surface facing said element mounting surface and said substrate includes a bottom surface positioned opposite from said element mounting surface; and
- a ratio H/L between a distance H from said bottom surface to said element mounting surface and a distance L along a direction of a long side of said main surface of said semiconductor light-emitting element is at least 0.3.

6. A semiconductor device according to claim 5 wherein an electrode is disposed on said main surface side of said semiconductor light-emitting element and is electrically connected to said first and/or said second conductor region.

7. A semiconductor device according to claim 5 wherein said main surface has an area of at least 1 mm$^2$.

8. A semiconductor device according to claim 3, wherein:
- said first conductor region comprises a first conductor portion that fills said first through-hole; and
- said second conductor region comprises a second conductor portion that fills said second through-hole.

9. A semiconductor device according to claim 2, wherein said bonding layer bonds a planar surface of said element mounting surface to a planar surface of said reflective member.

10. A semiconductor device according to claim 9, further comprising:
- a plating layer on the planar surface of said reflective member,
- wherein said bonding layer is interposed between said planar surface of said reflective member and said plating layer, and comprises an Au-based solder.

11. A semiconductor device according to claim 10, wherein said plating layer comprises Ni/Au.

12. A semiconductor device according to claim 9, further comprising:
- a film that is disposed on the planar surface of said element mounting surface,
- wherein said substrate comprises nitride aluminum,
- wherein said bonding layer comprises an Au-based solder, and
- wherein said bonding layer is bonded to said film.

13. A semiconductor device according to claim 12, wherein said film is an Au film.

14. A semiconductor device according to claim 13, further comprising one or more intermediate layers disposed between said Au film and said element mounting surface.

* * * * *